United States Patent
Hsu

(12) 
(10) Patent No.: US 7,393,819 B2
(45) Date of Patent: Jul. 1, 2008

(54) AMMONIA-FREE ALKALINE MICROELECTRONIC CLEANING COMPOSITIONS WITH IMPROVED SUBSTRATE COMPATIBILITY

(75) Inventor: Chien-Pin Sherman Hsu, Basking Ridge, NJ (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 703 days.

(21) Appl. No.: 10/483,037

(22) PCT Filed: Jul. 8, 2002

(86) PCT No.: PCT/US02/21374

§ 371 (c)(1),
(2), (4) Date: Jan. 6, 2004

(87) PCT Pub. No.: WO03/006597

PCT Pub. Date: Jan. 23, 2003

(65) Prior Publication Data

US 2004/0152608 A1 Aug. 5, 2004

(51) Int. Cl.
*G03F 7/023* (2006.01)

(52) U.S. Cl. ......................... 510/175; 510/201

(58) Field of Classification Search ................. 510/175, 510/201

See application file for complete search history.

(56) References Cited

U.S. PATENT DOCUMENTS

| | | | |
|---|---|---|---|
| 4,744,834 A | 5/1988 | Haq ............................. 134/38 |
| 5,091,103 A | 2/1992 | Dean et al. .................. 252/162 |
| 5,308,745 A | 5/1994 | Schwartzkopf | |
| 5,320,709 A | 6/1994 | Bowden et al. | |
| 5,417,877 A | 5/1995 | Ward | |
| 5,478,436 A | 12/1995 | Winebarger et al. | |
| 5,563,119 A | 10/1996 | Ward | |
| 5,571,447 A | 11/1996 | Ward et al. | |
| 5,698,503 A | 12/1997 | Ward et al. | |
| 5,709,756 A | 1/1998 | Ward et al. | |
| 5,855,811 A | 1/1999 | Groeger et al. | |
| 5,962,385 A | 10/1999 | Maruyama et al. .......... 510/176 |
| 6,043,005 A | 3/2000 | Haq | |
| 6,103,680 A | 8/2000 | Honda et al. | |
| 6,110,881 A | 8/2000 | Lee et al. ..................... 510/175 |
| 6,211,126 B1 | 4/2001 | Wojtczak et al. | |
| 6,225,030 B1 | 5/2001 | Tanabe et al. | |
| 2001/0025017 A1 | 9/2001 | Amemiya et al. | |
| 2002/0077259 A1* | 6/2002 | Skee .......................... 510/175 |

FOREIGN PATENT DOCUMENTS

| | | |
|---|---|---|
| EP | 0 662 705 A | 7/1995 |
| EP | 0 678 571 A | 10/1995 |
| EP | 0 690 483 A | 1/1996 |
| EP | 0 773 480 A | 5/1997 |
| EP | 0 901 160 A | 3/1999 |
| JP | 2001/005201 | 1/2001 |
| WO | WO 88/05813 | 8/1988 |
| WO | WO 88 05813 | 8/1988 |
| WO | WO 94 05766 A | 3/1994 |
| WO | WO 98 16330 A | 4/1998 |
| WO | WO 98 30677 A | 7/1998 |
| WO | WO 99 60448 | 11/1999 |
| WO | WO 01 40425 A | 4/2001 |
| WO | WO 02 33033 A | 4/2002 |
| WO | WO 02 45148 A | 6/2002 |

OTHER PUBLICATIONS

Patent Abstracts of Japan, vol. 2000, No. 16, May 8, 2001 of JP 2001 005201, Jan. 12, 2001.

* cited by examiner

*Primary Examiner*—Gregory E Webb
(74) *Attorney, Agent, or Firm*—George W. Rouchfuss, Jr.; Ohlandt, Greeley, Ruggiero & Perle

(57) ABSTRACT

Ammonia-free cleaning compositions for cleaning microelectronic substrates, and particularly to such cleaning compositions useful with and having improved compatibility with microelectronic substrates characterized by sensitive porous, low-κ and high-κ dielectrics and copper metallization. Cleaning compositions for stripping photoresists, cleaning residues from plasma generated organic, organometallic and inorganic compounds, and cleaning residues from planarization processes. The cleaning composition contain one or more non-ammonium producing strong base containing non-nucleophilic, positively charged counter ions and one or more steric hindered amide solvents.

16 Claims, No Drawings

AMMONIA-FREE ALKALINE MICROELECTRONIC CLEANING COMPOSITIONS WITH IMPROVED SUBSTRATE COMPATIBILITY

FIELD OF THE INVENTION

This invention relates to ammonia-free cleaning compositions for cleaning microelectronic substrates, and particularly to such cleaning compositions useful with and having improved compatibility with microelectronic substrates characterized by sensitive porous and low-κ and high-κ dielectrics and copper metallization. The invention also relates to the use of such cleaning compositions for stripping photoresists, cleaning residues from plasma generated organic, organometallic and inorganic compounds, and cleaning residues from planarization processes, such as chemical mechanical polishing (CMP), as well as an additive in planarization slurry residues.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etchant gases or chemical etchant solutions selectively attack the photoresist-unprotected area of the substrate. As a result of the plasma etching process, photoresist, etching gas and etched material by-products are deposited as residues around or on the sidewall of the etched openings on the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectronic device dimensions have decreased, it has become increasingly common in the art to employ copper metallizations, porous, low-κ and high-κ dielectrics. These materials have presented additional challenges to find acceptable cleaner compositions. Many process technology compositions that have been previously developed for "traditional" or "conventional" semiconductor devices containing Al/SiO$_2$ or Al(Cu)/SiO$_2$ structures cannot be employed with copper metallized low-κ or high-κ dielectric structures. For example, hydroxylamine based stripper or residue remover compositions are successfully used for cleaning devices with Al metallizations, but are practically unsuitable for those with copper metallizations. Similarly, many copper metallized/low-κ strippers are not suitable for Al metallized devices unless significant adjustments in the compositions are made.

Removal of these etch and/or ash residues following the etch and/or ashing process has proved problematic. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

The current back end cleaners show a wide range of compatibility with certain, sensitive dielectrics and metallizations, ranging from totally unacceptable to marginally satisfactory. Many of the current strippers or residue cleaners are not acceptable for advanced interconnect materials such as low-κ and high-κ dielectrics and copper metallizations. Additionally, the typical alkaline cleaning solutions employed are overly aggressive towards low-κ and high-κ dielectrics and/or copper metallizations. Moreover, many of these alkaline cleaning compositions contain organic solvents that show poor product stability, especially at higher pH ranges and at higher process temperatures.

BRIEF SUMMARY OF THE INVENTION

There is, therefore, a need for microelectronic cleaning compositions suitable for back end cleaning operations which compositions are effective cleaners and are applicable for stripping photoresists, cleaning residues from plasma process generated organic, organometallic and inorganic materials, and cleaning residues from planarization process steps, such as chemical mechanical polishing and the like. This invention relates to compositions that are effective in stripping photoresists, preparing/cleaning semiconductor surfaces and structures with good compatibility with advanced interconnect materials and copper metallizations.

It has been discovered that ammonia (NH$_3$) and ammonia-derived bases such as ammonium hydroxide and other salts (NH$_4$X, X=OH, carbonate, etc.) are capable of dissolving/corroding metals such as copper through complex formation. Thus they are poor choices to be used in semiconductor cleaning formulations when compatibility with porous, low-κ and high-κ dielectrics and copper metallizations are required. These compounds can generate ammonia through equilibrium process. Ammonia can form complex with metals such as copper and result in metal corrosion/dissolution as set forth in the following equations.

(Equation 1)

(Equation 2)

Thus, ammonium hydroxide and ammonium salts can provide nucleophilic and metal-chelating ammonia (NH$_3$) through the equilibrium process described in Equation 1, particularly when other bases such as amines and alkanolamines are added. In the presence of oxygen, metals such as copper can be dissolved/corroded through complex formation with ammonia, as described in Equation 2. Such complex formation can further shift the equilibrium (Equation 1) to the right, and provide more ammonia, leading to higher metal dissolution/corrosion.

Generally, sensitive low-κ dielectrics degrade significantly under strong alkaline conditions. Ammonia and ammonia derived bases also show poor compatibility with sensitive dielectrics, such as hydrogen silsesquioxane (HSQ) and methyl silsesquioxane (MSQ). Again, they can provide ammonia and/or other nucleophiles, and thus lead to reaction/degradation of sensitive dielectrics.

It has been discovered that non-ammonium producing strong base alkaline cleaning formulations containing non-nucleophilic, positively charged counter ions (such as tetraalkylammonium) in steric hindered amide solvents show much improved compatibility with sensitive porous, low-κ and high-κ dielectrics and copper metallization. The preferred solvent matrices are resistant to strong alkaline conditions, due to steric hindrance effects and/or low or no reactivity to nucleophilic reactions (with respect to nucleophiles such as hydroxide ions). The improved dielectric compatibility is partially achieved due to the absence of undesireable nucleophiles in the compositions. Good compatibility with copper metallization is achieved by selective use of certain copper-compatible steric hindered amide solvents. These components can be formulated into semi-aqueous to practically non-aqueous (organic-solvent based) cleaning solutions or slurries.

DETAILED DESCRIPTION OF THE INVENTION

The novel back end cleaning composition of this invention will comprise one or more of any suitable non-ammonium producing strong base containing non-nucleophilic, positively charged counter ions and one or more of any suitable steric hindered amide solvent stable under strong alkaline conditions. Among the suitable non-ammonia producing strong bases containing non-nucleophilic, positively charged counter ions suitable for use in the cleaning compositions of this invention there may be mentioned tetraalkylammonium hydroxides of the formula:

$$[(R)_4N^+]_p[X]^{-q}$$

where each R is independently a substituted or unsubstituted alkyl, preferably alkyl or hydroxy alkyl of from 1 to 22, and more preferably 1 to 6, carbon atoms (R≠H); and X=OH or a suitable salt anion, such as carbonate and the like; and p and q are equal and are integers of 1 to 3. Suitable strong bases also include KOH and NaOH. Cleaning compositions containing the non-ammonium producing strong bases containing non-nucleophilic, positively charged counter ions show much improved compatibility with low-κ dielectrics and copper metallization. Ammonia-free tetraalkylammonium hydroxides (TAAH) are very strong bases, yet they have been discovered to provide surprisingly improved low-κ compatibility compared to cleaning compositions with ammonium hydroxide. Especially preferred are tetramethylammonium hydroxide, tetrabutylammonium hydroxide, choline hydroxide and tetramethyl ammonium carbonate.

While previous attempts to control or inhibit metal corrosion have involved careful controlling of pH and/or using corrosion inhibiting compounds, such as benzotriazole (BT), at relatively low concentrations of <2% by weight, it has been discovered that unexpected, significant improvement in controlling copper metal corrosion can be provided to the cleaning compositions of this invention when one or more steric hindered amide solvent is employed. Any suitable steric hindered amide solvent may be employed in the cleaning compositions of this invention. Preferred as such steric hindered amide solvents are hindered acyclic and hindered cyclic amides of the formulae

and

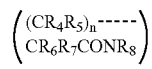

where n is a numeral of from 1 to 22, preferably 1 to 6; and $R_1$, $R_2$, $R_3$, $R_4$, $R_5$, $R_6$, $R_7$ and $R_8$ are each independently selected from H, alkyl (substituted or unsubstituted), preferably alkyl of from 1 to 6 carbon atoms, and aryl (substituted or unsubstituted), preferably aryl of from 3 to 14 carbon atoms, with the proviso the at least one of $R_1$, $R_2$, and $R_3$ and at least one of $R_4$, $R_5$, $R_6$, $R_7$ and $R_8$ is not hydrogen.

Some suitable examples of such steric hindered amide acyclic solvents include, for example, acetamide, dimethyl formamide (DMF), N,N'-dimethyl acetamide (DMAc), benzamide and the like. Some suitable examples of steric hindered cyclic amides include, for example, N-methyl-2-pyrrolidinone (NMP), 1,5-dimethyl-2-pyrrolidinone, 1,3dimethyl-2-piperidone, 1-(2-hydroxyethyl)2-pyrrolidinone, 1,5-dimethyl 2-piperidone and the like.

The cleaning compositions of this invention containing the non-ammonium producing strong bases can be formulated into aqueous, semi-aqueous or organic solvent-based compositions. The non-ammonium producing, strong bases containing non-nucleophilic, positively charged counter ions can be used with steric hindered amide solvents alone or in combination with other stable solvents, preferably one or more polar organic solvents resistant to strong bases and that do not contain unhindered nucleophiles, such as dimethyl sulfoxide (DMSO), sulfolane (SFL), dimethyl piperidone, diethanolamine, triethanolamine, 2-(methylamino)ethanol, 3-(dimethylamino)-1,2-propanediol and the like. The cleaning composition may also optionally contain organic or inorganic acids, preferably weak organic or inorganic acids, hindered amines, hindered alkanolamines, and hindered hydroxylamines and other corrosion inhibitors, such as benzotriazole, catechol, glycerol, ethylene glycol and the like. The cleaning compositions may also contain any suitable surfactants, such as for example dimethyl hexynol (Surfynol-61), ethoxylated tetramethyl decynediol (Surfynol-465), polytetrafluoroethylene cetoxypropylbetaine (Zonyl FSK), (Zonyl FSH) and the like. Thus, a wide range of processing/operating pH and temperatures can be used in effectively removing and cleaning photoresists, post plasma etch/ash residues, sacrificial light absorbing materials and anti-reflective coatings (ARC). It has also found that some of this type formulations are particularly effective to clean very difficult samples which contain tantalum in their structure, such as tantalum (Ta) or tantalum nitride barrier layers and tantalum oxides.

Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits. The silicates may be present in the composition in an amount of from about 0 to 10 wt. %, preferably in an amount of from about 0.1 to about 5 wt. %.

The compositions of the present invention may also be formulated with suitable metal chelating agents to increase the capacity of the formulation to retain metals in solution and to enhance the dissolution of metallic residues on the wafer substrate. The chelating agent will generally be present in the compositions in an amount of from about 0 to 5 wt. %, preferably from an amount of from about 0.1 to 2 wt. %.

Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and EDTMP.

The cleaning compositions may also optionally contain fluoride compounds in cleaning composition, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in an amount of from 0 to 10 wt. %, preferably from about 0.1 to 5 wt. %.

The cleaning compositions of this invention will generally comprise from about 0.05 to about 30 wt. % of the non-ammonium producing strong base; from about 5 to about 99.95 wt. % of the steric hindered amide solvent component; from about 0 to about 95 wt. % water or other organic co-solvent; from about 0 to 40 wt. % steric hindered amines or alkanolamines; about 0 to 40 wt. % organic or inorganic acids; about 0 to 40 wt. % metal corrosion inhibitor compounds such as benzotriazole, catechol, glycerol, ethylene glycol and the like; from about 0 to 5% wt. % surfactant; form about 0 to 10 wt. % metal ion free silicate; from about 0 to 5 wt. % metal chelating agent; and from about 0 to 10 wt. % fluoride compound.

Examples of these types of formulations are set forth in the following Table 1.

TABLE 1

| COMPONENT | COMPOSITION_PARTS BY WEIGHT | | | | | | | |
|---|---|---|---|---|---|---|---|---|
| | A | B | C | D | E | F | G | H |
| DMPD | 32 | 16 | 16 | | 20 | | 50 | 16 |
| H₂O | 32 | 32 | 32 | | | | | 32 |
| TMAH | 16 | 16 | 16 | 10 | 10 | 10 | 10 | 16 |
| TEA | | 16 | | | | | | 15 |
| CyDTA | | 0.2 | | | | | | |
| SFL | | | 16 | | 30 | | | |
| HEP | | | | 50 | | | | |
| NMP | | | | | | 50 | | |
| EDTMP | | | | | | | | 0.4 |

DMPD = dimethyl piperidone
TMAH = 25% tetramethylammonium hydroxide
TEA = triethanolamine
CyDTA = trans-1,2-cyclohexanediamine tetraacetic acid
SFL = sulfolane
HEP = 1-(2-hydroxyethyl)-2-pyrrolidinone
NMP = N-methyl pyrrolidinone
EDTMP = ethylenediamine tetra(methylene phosphonic acid)

The copper etch rates for cleaning Compositions D, E, F G and H of Table 1 are demonstrated by the etch rate data in the following Tables 2 and 3. The etch rate was determined utilizing the following test procedure.

Pieces of copper foil of approximately 13×50 mm were employed. The thickness of the foil pieces was measured. After cleaning the foil pieces with 2-propanol, distilled water and acetone and the foil pieces are dried in a drying oven. The cleaned, dried foil pieces were then placed in loosely capped bottles of preheated cleaning compositions of the invention and placed in a vacuum oven for a period of from two to four hours at the indicated temperature. Following treatment and removal from the oven and bottles, the cleaned foils were rinsed with copious amounts of distilled water and dried in a drying oven for about 1 hour and then permitted to cool to room temperature, and then the etch rate determined based on weight loss or weight change.

The results are set forth in Tables 2 and 3.

TABLE 2

| Composition | Cu Etch Rate (Å/hour) at 70-75° C. (24 hour test) |
|---|---|
| D | <10 |
| E | <10 |
| F | <10 |
| G | <10 |

TABLE 3

| Composition | Cu Etch Rate (Å/hour) at 65° C. (24 hour test) |
|---|---|
| H | 1 |

The cleaning capability of compositions of this invention is illustrated in the following tests in which a microelectronic structure that comprised a wafer of the following structure, namely, PR/ARC/CDO/SiN/Cu Dual Damascene (post trench etch) where PR="photoresist and ARC=anti-reflective coating, was immersed in cleaning solutions for the indicated temperature and time, were then water rinsed, dried and then the cleaning determined by SEM inspection. The results are set forth in Table 4.

TABLE 4

| Composition and Process Conditions | Cleaning Performance | Substrate Compatibility |
|---|---|---|
| Composition H 75° C., 20 min | 100% Clean; Removed all the PR, ARC and residues | Compatible with Cu and CDO |

With the foregoing description of the invention, those skilled in the art will appreciate that modifications may be made to the invention without departing from the spirit and scope of thereof. Therefore, it is not intended that the scope of the invention be limited to the specific embodiments illustrated and described.

I claim:

1. A cleaning composition having the property of being capable of cleaning residues from microelectronic substrates having on the substrate (1) a dielectric that is a porous dielectric, a low-κ dielectric or a high-κ dielectric, and (2) copper metallization, said cleaning composition is a silicate free composition and consists of:

from about 0.05% to 30% by weight of one or more non-ammonia producing strong base containing non-nucleophilic, positively charged counter ions;

from about 5 to about 99.95% by weight of dimethyl piperidone;

from about 0 to about 95% by weight water or other organic co-solvent;

from about 0 to 40% by weight of an other metal corrosion inhibitor compounds;

from 0 to 5% by weight of a surfactant;

from about 0 to about 5% by weight of a metal chelating agent selected from the group consisting of trans-1,2-cyclohexanediamine tetraacetic acid and ethylenediamine tetra(methylene phosphonic acid); and from about 0 to 10% by weight of a fluoride compound;

wherein the water or other organic co-solvent consists of water or at least one other organic co-solvent selected from the group consisting of dimethyl sulfoxide, sulfolane, diethanolamine, triethanolamine, 2-(methylamino)ethanol and 3-(diethylamino)-1,2-propanediol.

2. A cleaning composition of claim 1 wherein the non-ammonia producing strong base is a tetraalkylammonium hydroxide or salt thereof.

3. A cleaning composition of claim 2 wherein the tetraalkylammonium hydroxide or salt is a compound of the formula:

wherein each R is a substituted or unsubstituted alkyl group and X is OH or a salt anion; and p and q are equal and are integers of from 1 to 3.

4. A cleaning composition of claim 3 wherein R is an alkyl group containing 1 to 22 carbon atoms and X is OH or carbonate.

5. A cleaning composition of claim 4 wherein R is an alkyl group of from 1 to 6 carbon atoms.

6. A cleaning composition of claim 1 consisting of tetramethylammoniun hydroxide, dimethyl piperidone, triethanolamine, trans-1,2-cyclohexanediamine tetraacetic acid and water.

7. A cleaning composition of claim 1 consisting of tetramethylammoniun hydroxide, dimethyl piperidone and water.

8. A cleaning composition of claim 1 consisting of tetramethylammoniun hydroxide, dimethyl piperidone, triethanolamine, ethylenediamine tetra(methylene phosphonic acid) and water.

9. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 2.

10. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 3.

11. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 4.

12. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 5.

13. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 1.

14. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 6.

15. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 7.

16. A process for cleaning a microelectronic substrate having (1) a dielectric that is a porous dielectric, a low-κ dielectric, or a high-κ dielectric, and (2) copper metallization, the process comprising contacting the substrate with a cleaning composition for a time sufficient to clean the substrate, wherein the cleaning composition consists of the composition of claim 8.

* * * * *